United States Patent
Liu et al.

(10) Patent No.: US 9,142,486 B2
(45) Date of Patent: Sep. 22, 2015

(54) CHIP PACKAGE AND FABRICATION METHOD THEREOF

(76) Inventors: Tsang-Yu Liu, Zhubei (TW); Yi-Ming Chang, Pingzhen (TW); Tzu-Min Chen, Zhongli (TW)

(*) Notice: Subject to any disclaimer, the term of this patent is extended or adjusted under 35 U.S.C. 154(b) by 158 days.

(21) Appl. No.: 13/554,499

(22) Filed: Jul. 20, 2012

(65) Prior Publication Data

US 2013/0020700 A1  Jan. 24, 2013

(30) Foreign Application Priority Data

Jul. 20, 2011  (TW) .............................. 100125751 A

(51) Int. Cl.

| H01L 23/48 | (2006.01) |
|---|---|
| H01L 23/16 | (2006.01) |
| H01L 21/56 | (2006.01) |
| H01L 27/146 | (2006.01) |
| H01L 23/31 | (2006.01) |
| H01L 23/58 | (2006.01) |
| H01L 23/00 | (2006.01) |

(52) U.S. Cl.
CPC ............ *H01L 23/481* (2013.01); *H01L 21/561* (2013.01); *H01L 23/16* (2013.01); *H01L 24/94* (2013.01); *H01L 27/14618* (2013.01); *H01L 27/14683* (2013.01); *H01L 23/3114* (2013.01); *H01L 23/585* (2013.01); *H01L 24/05* (2013.01); *H01L 24/13* (2013.01); *H01L 2224/02372* (2013.01); *H01L 2224/0401* (2013.01); *H01L 2224/05548* (2013.01); *H01L 2224/13022* (2013.01); *H01L 2924/01029* (2013.01); *H01L 2924/12041* (2013.01); *H01L 2924/1461* (2013.01); *H01L 2924/15788* (2013.01); *H01L 2924/16235* (2013.01)

(58) Field of Classification Search
None
See application file for complete search history.

(56) References Cited

U.S. PATENT DOCUMENTS

| 4,675,788 | A | * | 6/1987 | Breitling et al. | ............... 361/792 |
|---|---|---|---|---|---|
| 2001/0038144 | A1 | * | 11/2001 | Grigg | ............................. 257/698 |
| 2004/0166603 | A1 | * | 8/2004 | Carley | ............................. 438/52 |
| 2004/0212047 | A1 | * | 10/2004 | Joshi et al. | ..................... 257/620 |
| 2004/0238944 | A1 | * | 12/2004 | Bish et al. | ...................... 257/706 |
| 2006/0148317 | A1 | * | 7/2006 | Akaike et al. | ................. 439/607 |
| 2011/0079892 | A1 | * | 4/2011 | Tsai et al. | ..................... 257/700 |
| 2012/0313222 | A1 | * | 12/2012 | Lee et al. | ...................... 257/620 |

FOREIGN PATENT DOCUMENTS

| TW | 499746 | 8/2002 |
|---|---|---|
| TW | 201125097 | 7/2011 |

* cited by examiner

*Primary Examiner* — Eva Y Montalvo
*Assistant Examiner* — Kevin Quinto
(74) *Attorney, Agent, or Firm* — Liu & Liu

(57) ABSTRACT

An embodiment of the present invention relates to a chip package and fabrication method thereof, which includes a semiconductor substrate containing a chip area and a peripheral pad area surrounding the chip area, wherein a conductive pad and a through hole exposing the conductive pad are formed in the peripheral pad area; a protection layer covering a bottom surface of the semiconductor substrate and the through hole; a packaging layer formed on an upper surface of the semiconductor substrate; and a spacing layer formed between the packaging layer and the semiconductor substrate, wherein the chip packaging has a main side surface constituted of side surfaces of the semiconductor substrate, the protecting layer, the packaging layer and the spacing layer, and wherein the main side surface has at least one recess portion.

28 Claims, 16 Drawing Sheets

CHIP PACKAGE AND FABRICATION METHOD THEREOF

This Application claims the benefit of Taiwan Patent Application No. 100125751 filed on Jul. 20, 2011, the entirety of which is incorporated by reference herein.

BACKGROUND OF THE INVENTION

1. Field of the Invention

The present invention relates to a chip package, and in particular relates to a chip package having reduced stress at the interface between layers and a method for fabricating the same.

2. Description of the Related Art

Wafer level packaging techniques have been developed for chip packaging. A semiconductor wafer is usually bonded to a glass substrate with a spacing layer disposed therebetween. After a wafer level package is accomplished, a dicing step is performed between chips to divide them into individual chips.

An ordinary chip package may comprise a semiconductor substrate, a protection layer, a spacing layer and a glass substrate. There are some interfaces between them. However, the materials and their expansion coefficients of the above layers are different from each other. Thus, delamination may occur at the interface between any two adjacent layers of the semiconductor substrate, the protection layer, the spacing layers and the glass substrate. Therefore, moisture and air will penetrate into the chip package and result in poor electrical characteristics of the chip package.

A novel chip package and a fabrication method thereof are needed to address the above issues.

BRIEF SUMMARY OF THE INVENTION

According to an illustrative embodiment of the invention, a chip package is provided. The chip package includes a semiconductor substrate containing a chip area and a peripheral pad area surrounding the chip area, wherein a conductive pad and a through hole exposing the conductive pad are formed in the peripheral pad area; a protection layer covering a bottom surface of the semiconductor substrate and the through hole; a packaging layer formed on an upper surface of the semiconductor substrate; and a spacing layer formed between the packaging layer and the semiconductor substrate, wherein the chip packaging has a main side surface constituted of side surfaces of the semiconductor substrate, the protecting layer, the packaging layer and the spacing layer, and wherein the main side surface has at least one recess portion.

According to another illustrative embodiment of the invention, a method for forming a chip package is provided. The method includes providing a semiconductor wafer including: a plurality of chip areas and a plurality of peripheral pad areas surrounding the chip areas, wherein each of the peripheral pad areas has a conductive pad and a through hole exposing the conductive pad formed thereon, and any two adjacent peripheral pad areas have a scribe line therebetween; a packaging layer bonded to an upper surface of the semiconductor substrate by means of a spacing layer; a protection layer covering a bottom surface of the semiconductor substrate and the through hole; removing at least a portion of the packaging layer along the scribe lines such that the packaging layer has recess portions having a first width; and dicing the semiconductor wafer with a second width along the scribe lines to form a plurality of chip packages, wherein the first width is different from the second width.

According to yet another illustrative embodiment of the invention, a method for forming a chip package is provided. The method includes providing a semiconductor wafer including a plurality of chip areas and a plurality of peripheral pad areas surrounding the chip areas, wherein each of the peripheral pad areas has a conductive pad and a through via hole exposing the conductive pad formed thereon, and any two adjacent peripheral pad areas have a scribe line therebetween; bonding a packaging layer to an upper surface of the semiconductor substrate by means of a spacing layer; forming a protection layer covering a bottom surface of the semiconductor substrate and the through hole; removing at least a portion of the protection layer on the dice channel such that the packaging layer has recess portions having a first width; and dicing the semiconductor wafer with a second width along the scribe lines to form a plurality of chip packages.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
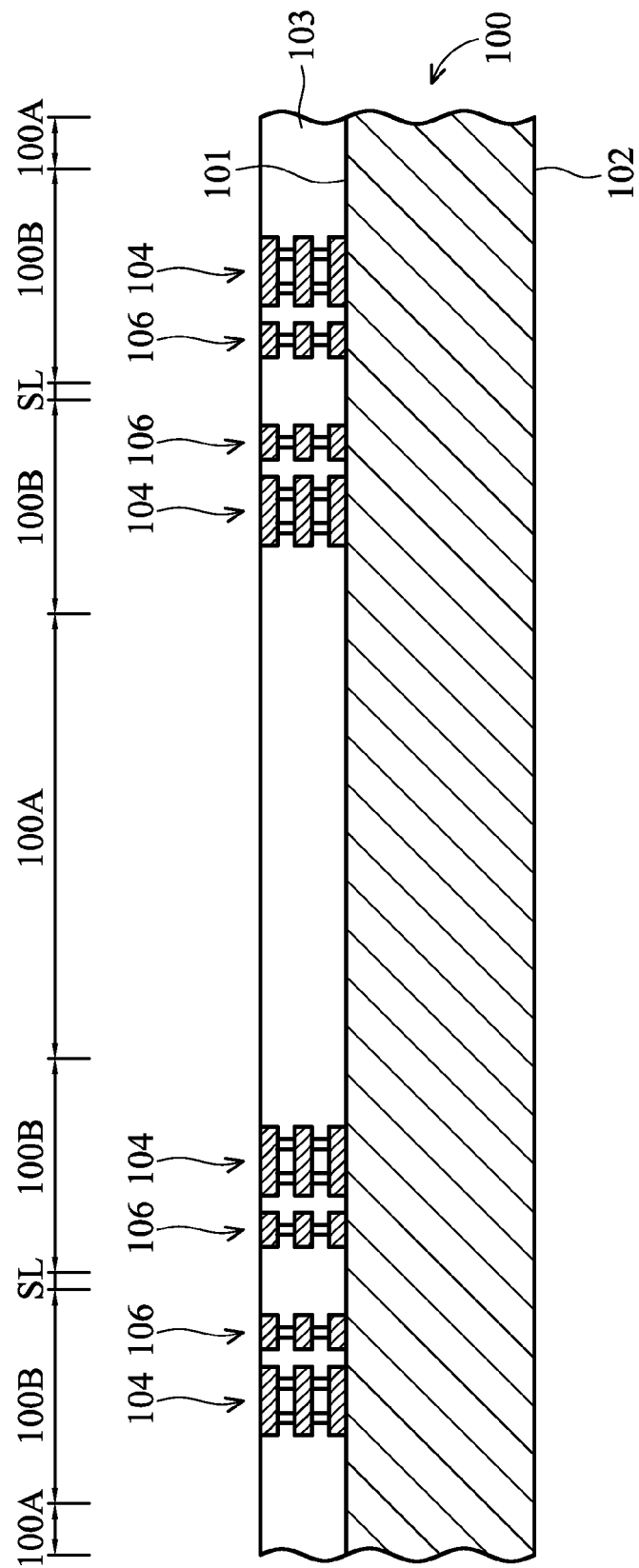
FIGS. 1A-1I illustrate cross sectional views showing the steps of fabricating a chip package according to an embodiment of the invention.

The present invention will be illustrated in detail with references made to the accompanying drawings. In the drawings or the description, similar or same reference numbers are used to designate similar or same elements. In addition, sizes or shapes of elements shown in the drawings may be expanded for clarity or simplicity. Further, each element shown in the drawings will be illustrated. It should be understood that any element not shown or described may be any kind of conventional element as known by those skilled in the art. In addition, a specific embodiment is merely an example disclosing a specific use of the invention, which is not used to limit the present invention.

Although only image sensor packages are used herein to illustrate chip package embodiments of the invention in this description, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power modules.

The wafer level packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form electronic device packages of multi-layered integrated circuit devices by stacking a plurality of wafers having integrated circuits together.

Here, a chip package and a method for fabricating thereof of an embodiment of the invention are illustrated. Independent chip packages are obtained by dicing the semiconductor wafer after the wafer level package is accomplished. The chip package according to an embodiment of the invention may comprise a main side surface constituted of side surfaces of a semiconductor substrate, a protection layer, a packaging layer, and a spacing layer. The main side surface of the chip package may contain at least one recess portion for preventing the occurrence of delamination during the dicing process.

Referring to FIGS. 1A through 1I, illustrated are cross sectional views showing the steps of fabricating a chip package according to an embodiment of the invention. As shown in FIG. 1, a semiconductor wafer containing a plurality of chips is first provided. The semiconductor wafer 100, such as a silicon wafer, may have an upper surface 101 and a bottom surface 102. In addition, the semiconductor wafer 100 may comprise a plurality of chip areas 100A, wherein any two adjacent device regions 100A may comprise a peripheral pad region 100B therebetween. Semiconductor devices such as image sensor chips or MEMs are disposed in the chip areas 100A.

The semiconductor wafer 100 may also comprise a plurality of conductive pads 104 and a plurality of seal rings 106 disposed on the peripheral pad region 100B. The conductive pads 104 and the seal rings 106 may comprise a plurality of metals layers and vias. The seal rings 106 are surrounded by the conductive pads 104, and the chip areas 100A are surrounded by the conductive pads 104 and the seal rings 106. A scribe line (SL) may be defined between any two adjacent seal rings 106. The semiconductor wafer 100 further comprises an inter-layer dielectric layer 103 formed on an upper surface 101 of the semiconductor wafer 100, and the conductive pads 104 and the seal rings 106 may be disposed in the inter-layer dielectric layer 103.

Figure 1B:
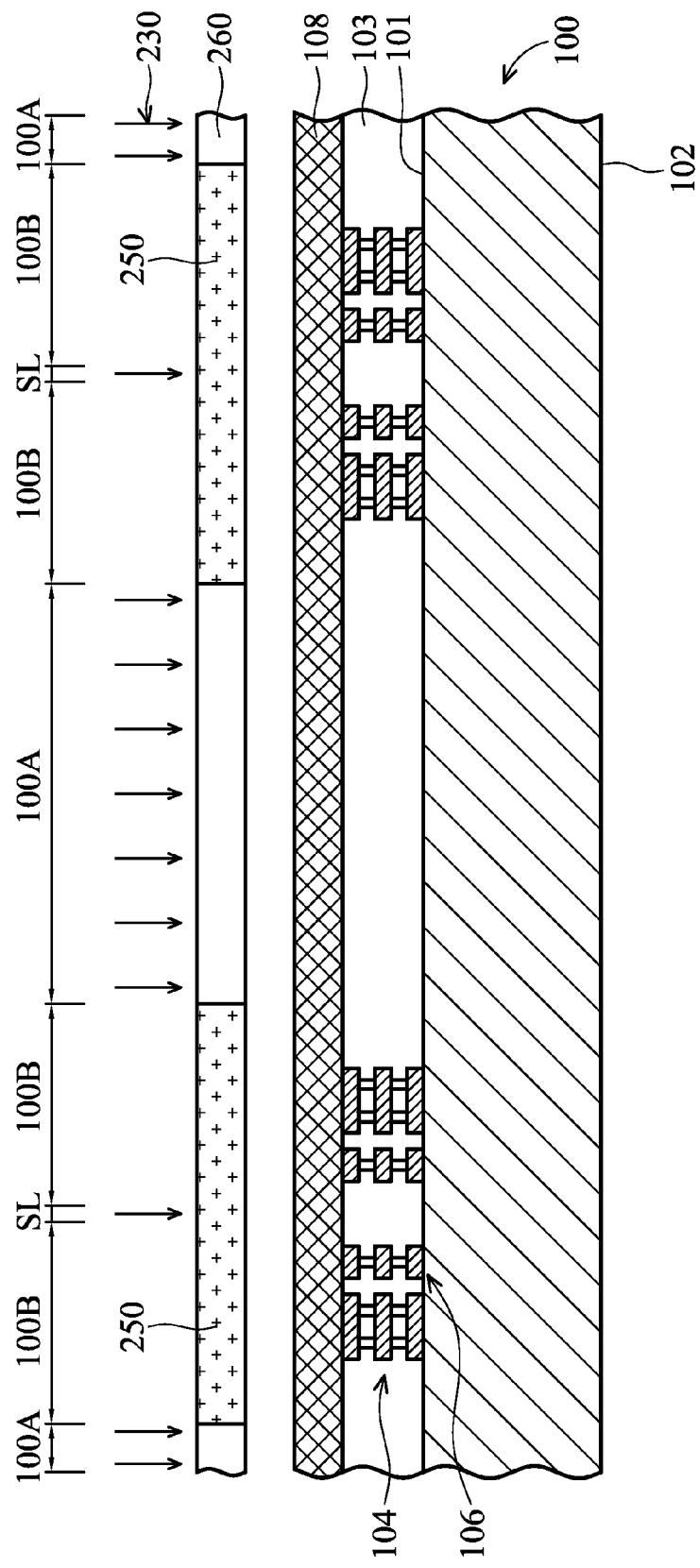
Figure 1C:
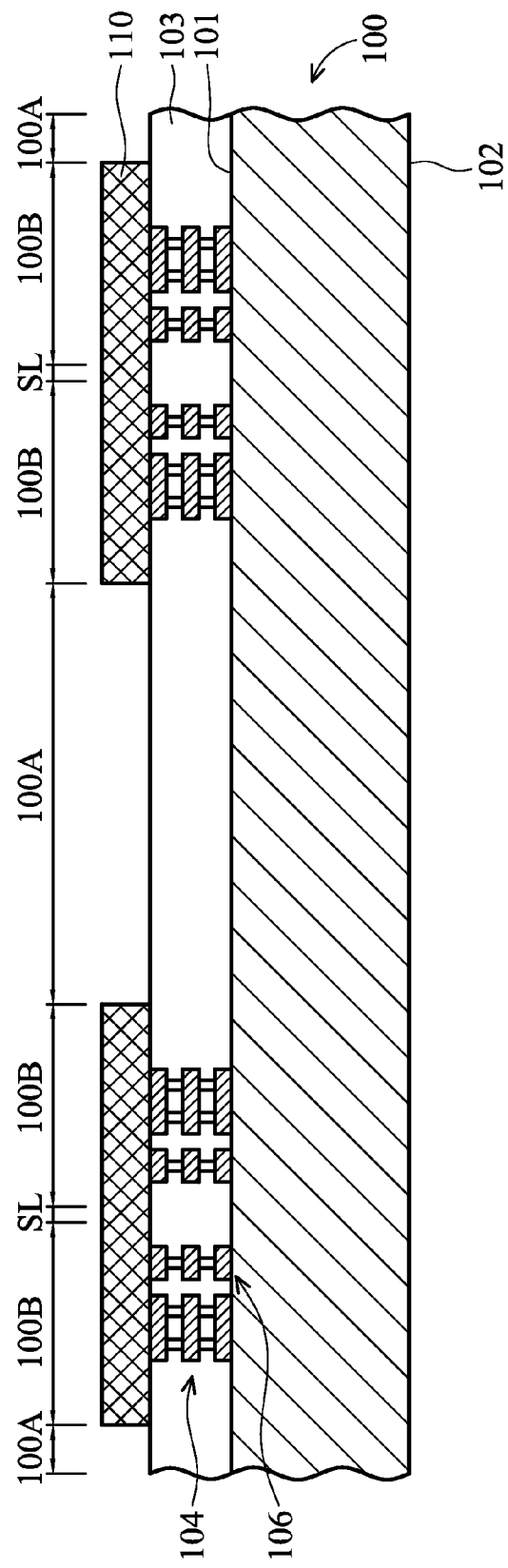

Referring to FIG. 1B, a spacing material 108 is formed on and fully covers the upper surface 101 of the semiconductor wafer 100. The spacing material 108 may be a photosensitive material such as an epoxy, a solder mask, or etc. The spacing material 108 may be formed by a coating method. As shown in FIG. 1B, a photomask 260 having a mask pattern 250 may be provided. The mask pattern 260 may be disposed over the spacing material 108. Then, an exposure process and a development process may be performed on the spacing material 108 using the photomask 260 to transfer the mask pattern 250 to the spacing material 108 to form a patterned spacing layer 110. As shown in FIG. 1C, the spacing layer 110 may be formed on the peripheral pad area 100B and surround the chip area 100A. When observed from a top plan view, two adjacent chip areas are separated from each other by the spacing layer.

Figure 1D:
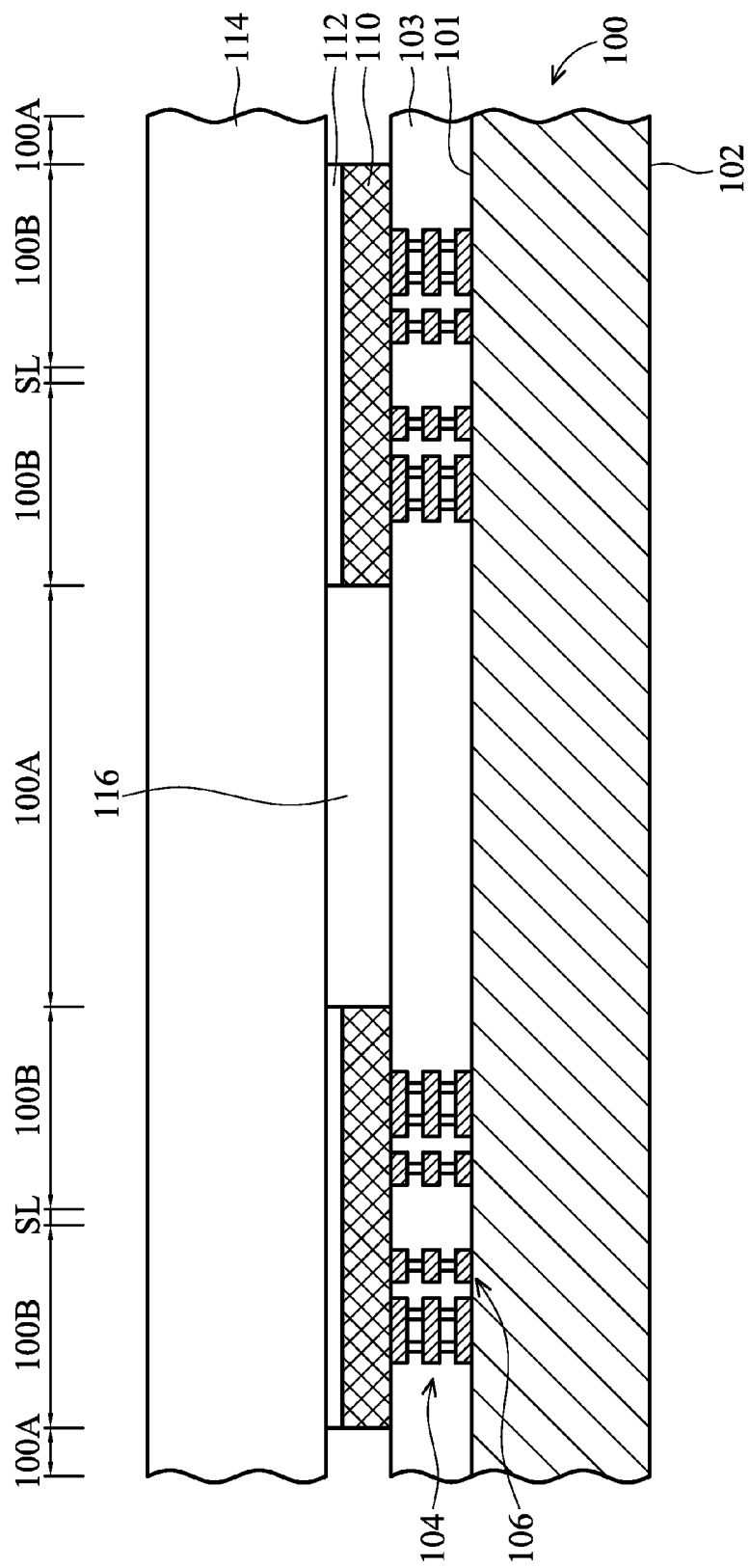

Next, as shown in FIG. 1D, a packaging layer 114 may be bonded to the semiconductor wafer 100. The packaging layer 114 may be a glass substrate or another blanket wafer. In an embodiment, the packaging layer 114 may be spaced apart from the semiconductor wafer 100 by means of the spacing layer 110, and a cavity 116 surrounded by the spacing layer 110 may be formed. In this embodiment, the spacing layer 110 may be formed on the semiconductor wafer 100 first, and then bonded to the packaging layer 114 by means of an adhesive layer 112. In another embodiment, the spacing layer 110 may be formed on the packaging layer 114 first, and then bonded to the semiconductor wafer 100 by means of an adhesive layer (not shown). Thus, the adhesive layer (not shown) may be formed between the spacing layer 110 and the semiconductor wafer 100.

The adhesive layer may be coated on the spacing layer 110 by screen printing. Thus, the adhesive layer may have a pattern which is substantially the same with that of the spacing layer 110.

Figure 1E:
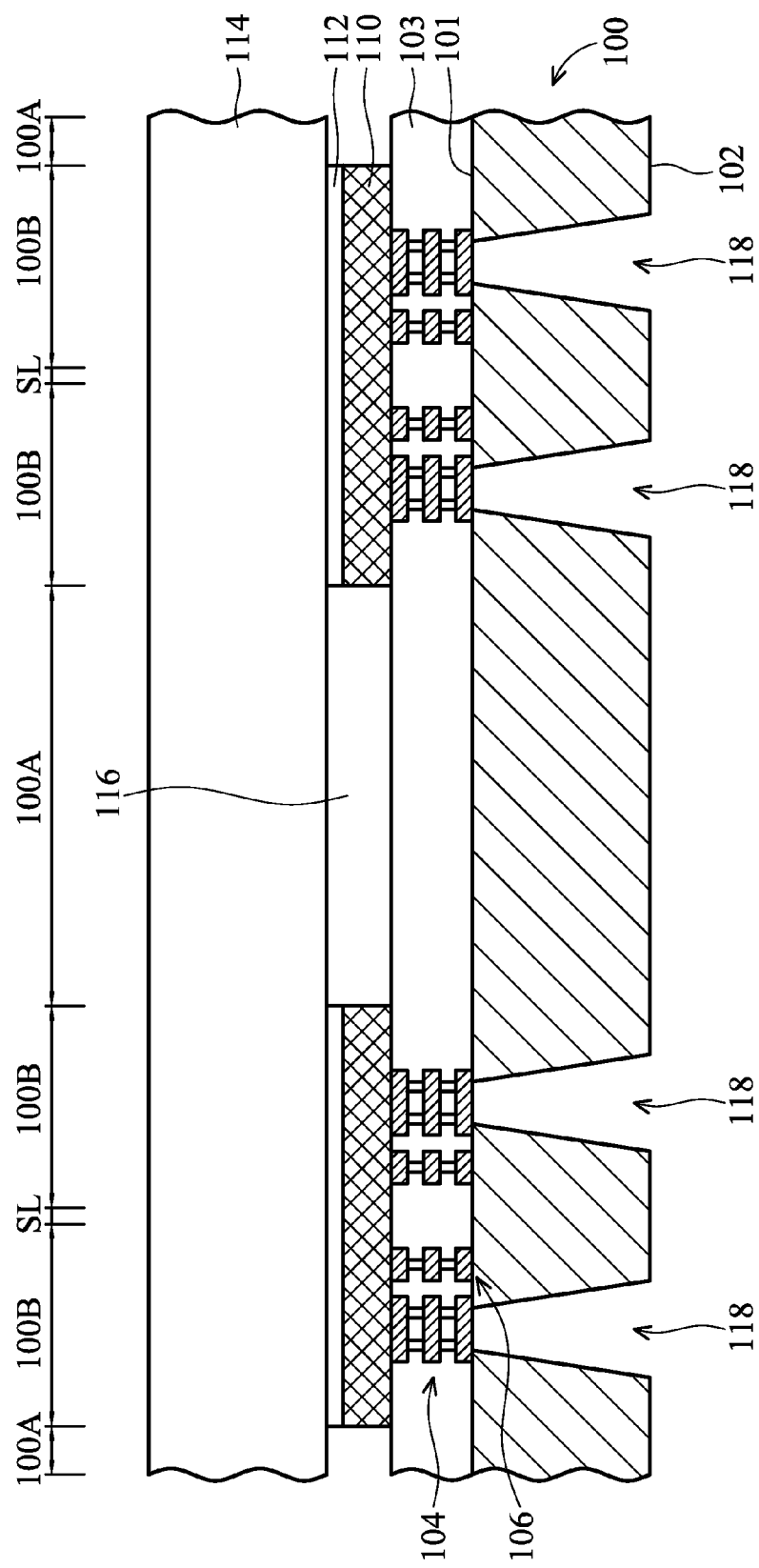
Figure 1F:
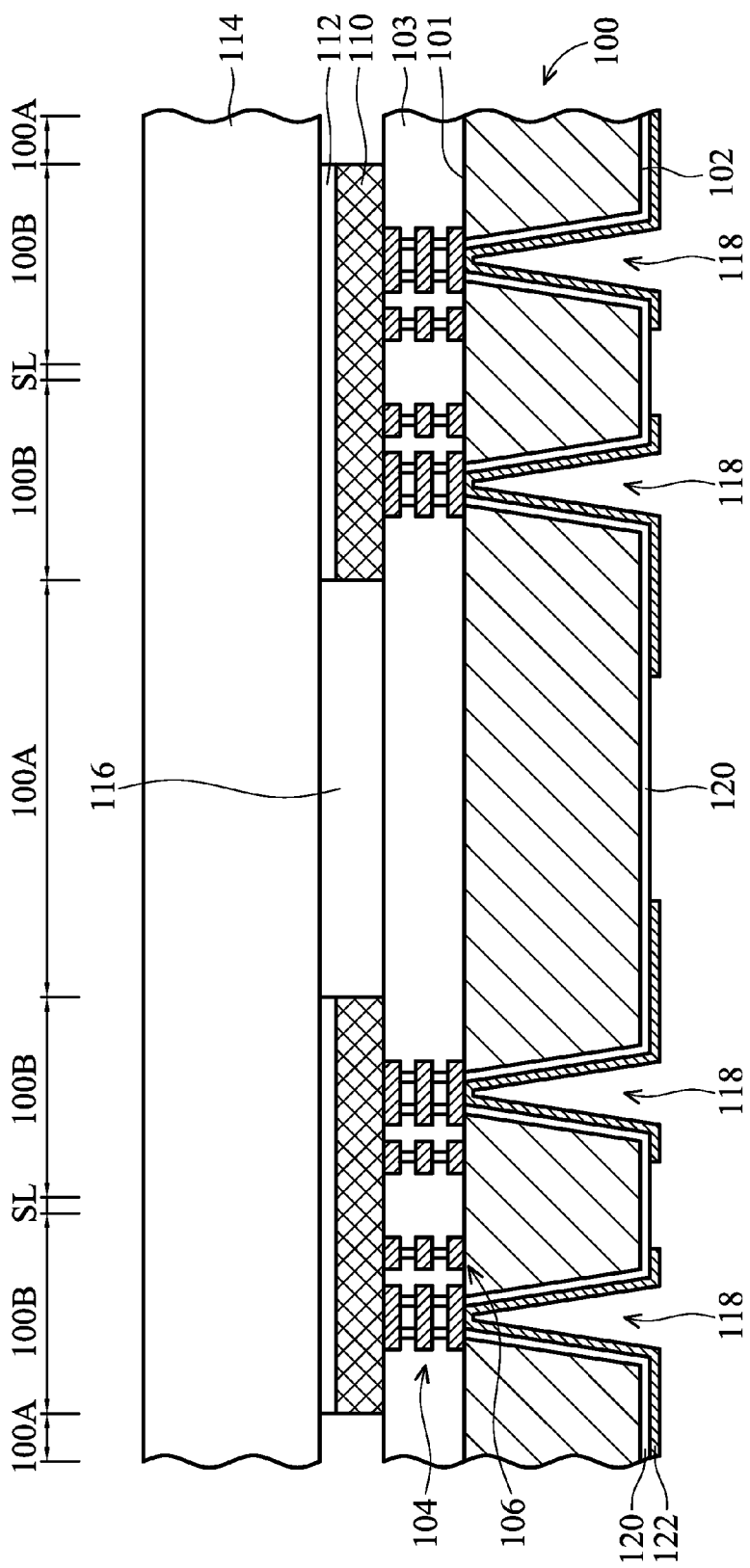

Next, referring to FIG. 1E, through holes 118 exposing the conductive pads 104 may be formed from the bottom surface 102 of the semiconductor wafer 100. The through holes 118 can be formed by lithography, etching or laser drilling. As shown in FIG. 1F, an insulating layer 120 may be formed on the bottom surface 102 of the semiconductor wafer 100 and the sidewalls of the through holes 118. The insulating layer 120 may be a non-photosensitive insulating material such as silicon oxide, silicon nitride, or silicon oxynitride. The insulating layer 120 may be formed by thermal oxide, chemical vapor deposition (CVD), or physical vapor deposition (PVD) such that the insulating layer 120 may conformally cover the bottom surface 102 of the semiconductor wafer 100 and the sidewalls of the through holes 118. Then, as shown in FIG. 1F, a portion of the insulating layer 120 that is at the bottom of the through holes 118 may be removed.

Then, a conductive trace layer 122 may be formed on the insulating layer 120. The conductive trace layer 122 may be extended to the bottom of the through holes 118 for electrical connection to the conductive pads 104. The conductive trace layer 122 may be formed by depositing a conductive material (not shown) on the insulating layer 120 and in the through holes 118 and patterning the conductive material by lithography and etching.

Figure 1G:
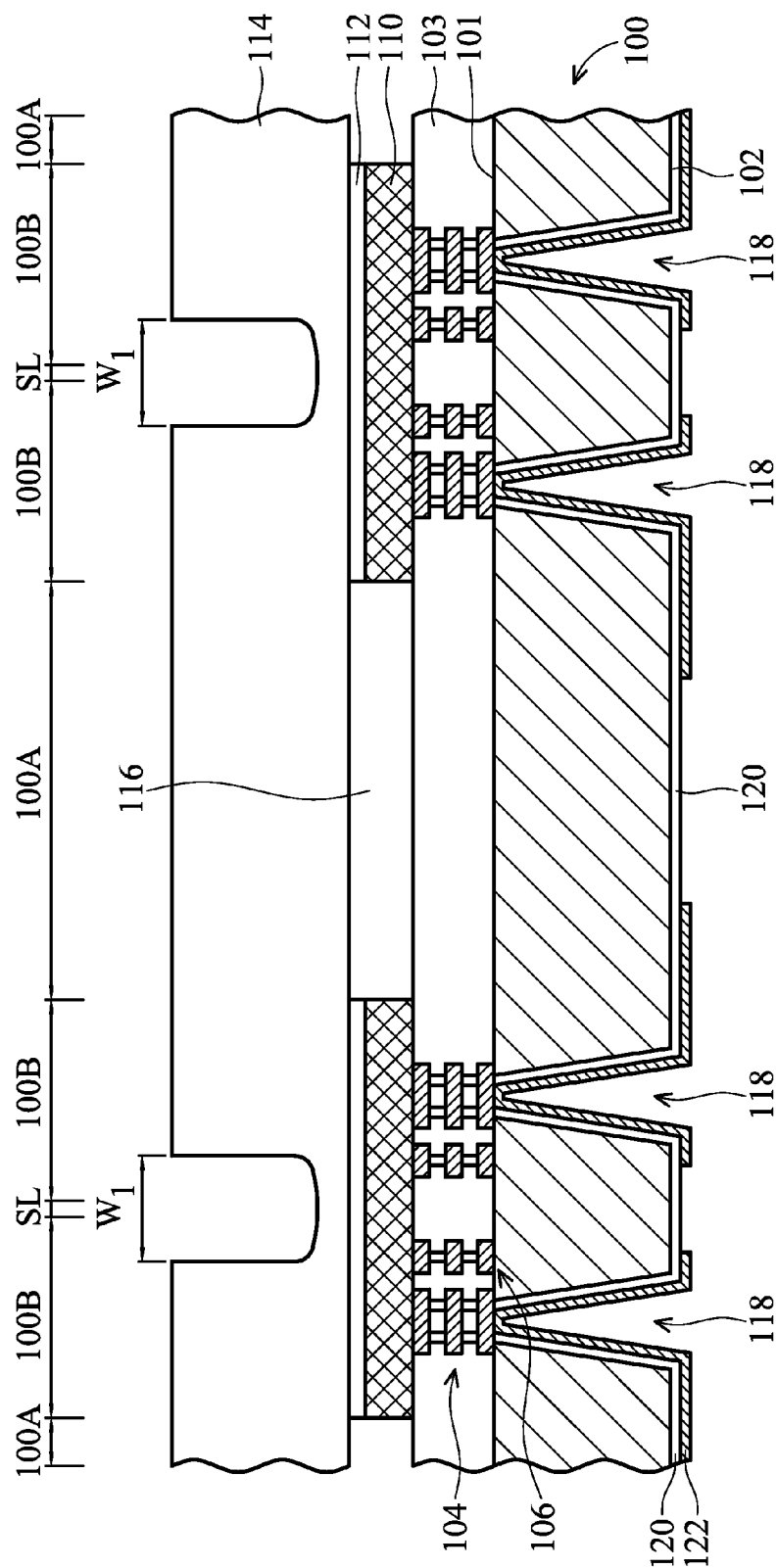

Then, referring to FIG. 1G, at least a portion of the packaging layer 114 may be removed along the scribe line SL such that the packaging layer 114 may have a recess portion having a first width W1 formed therein. Then at least a portion of the packaging layer 114 may be removed by using a cutting knife, laser, wet etching, dry etching, or etc. In an embodiment, not only is a portion of the packaging layer 114 removed, but also a portion of the spacing layer 110 can be removed. In a preferred embodiment, the first width W1 may not be greater than the width of the spacing layer 110.

Figure 1H:
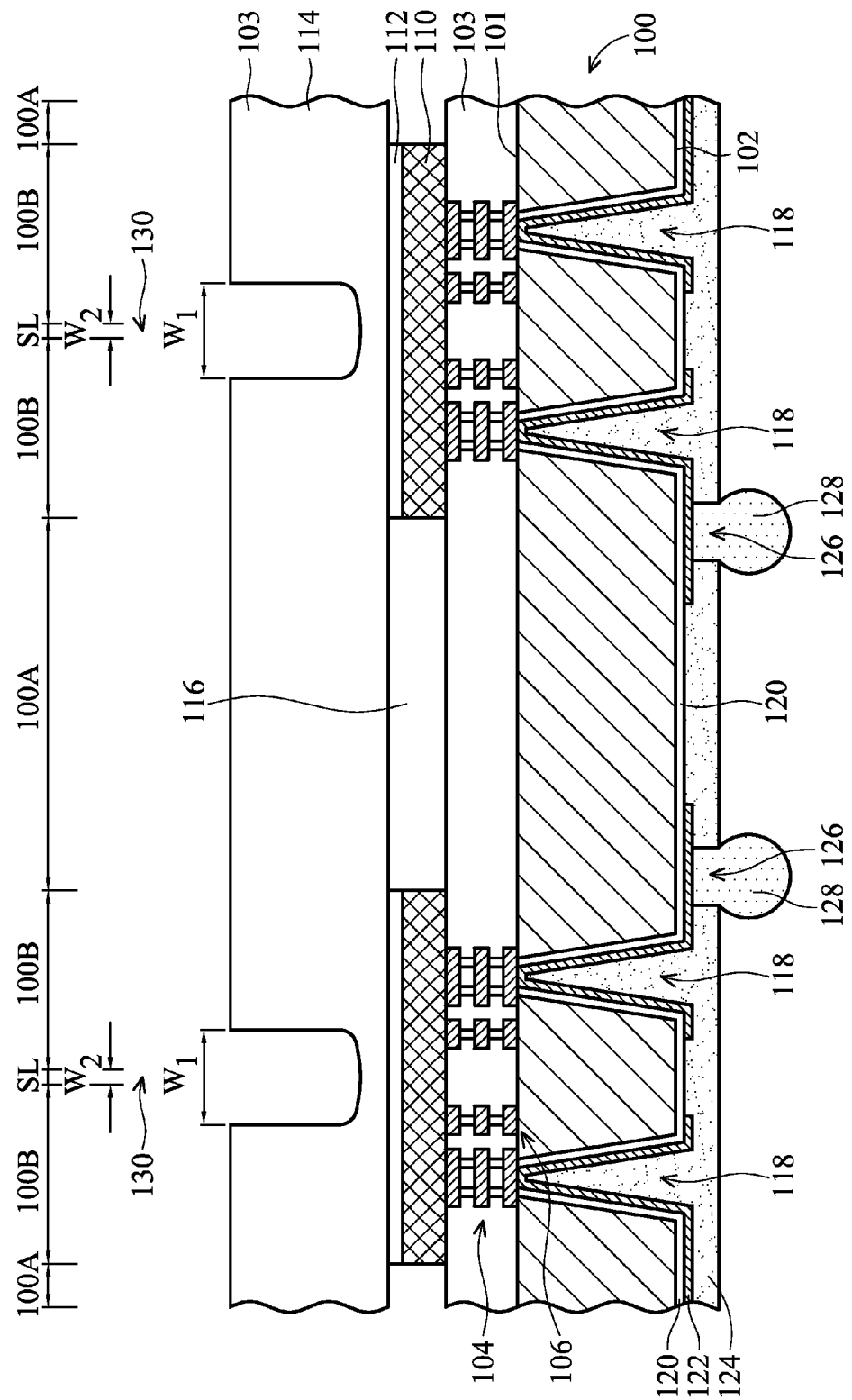

As shown in FIG. 1H, a protection layer 124 may be coated on the insulating layer 120 and the conductive trace layer 122. Thus, the conductive trace layer 122 may be covered by the protection layer 124. The protection layer 124 may comprise a photosensitive material such as a solder mask. Then, the protection layer 124 may be patterned by lithography for forming an opening 126. The opening 126 may expose a portion of the conductive trace layer 122. Then, a conductive bump 128 may be formed by filling a solder material into the openings 124 of the protection layer 124 and then performing a reflow process. The conductive bump 128 may be a solder ball or a solder paste.

Finally, the semiconductor wafer 100 is diced with a second width W2 along the line 130 in the scribe line SL from the bottom surface 102 of the semiconductor wafer 100. For example, the semiconductor wafer 100 may be diced by using a cutting knife having a second width W2. It should be noted that although the width W2 is greater than the width W1 as shown in FIG. 1H, however, the width W2 can also be less than the width W1 (not shown). For example, the packaging layer 114 is etched first to form a recess portion having a width W1, and then the semiconductor wafer 100 is etched by a cutting knife having a width W2. The width W2 may be greater or less than the width W1. Alternatively, the packaging layer 114 and the semiconductor layer 100, respectively, may be diced by different cutting knives which have different widths W1 and W2, with any possible orders. For example, the packaging layer 114 and the semiconductor layer 100, respectively, may be diced in sequence, or in alternation order. For example, the dicing step may be performed to the semiconductor wafer from its back side (the side far away to the packaging layer 114), and then another dicing step may be performed to the semiconductor wafer from its front side (such as from the packaging layer 114) to form a plurality of chip packages.

Figure 1I:
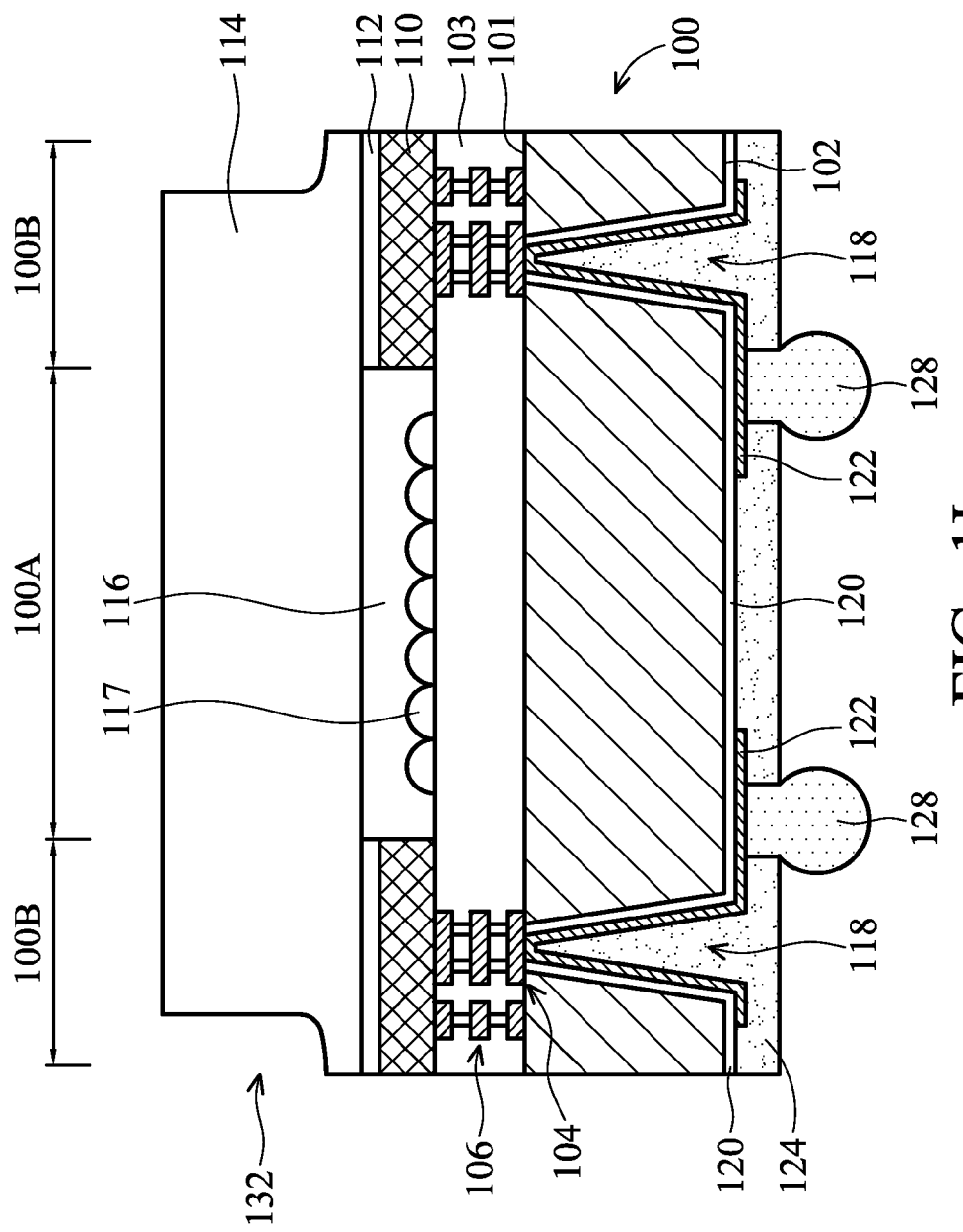

Referring to FIG. 1I, illustrated is a cross-view of the chip package according to an embodiment of the present invention. The semiconductor substrate 100 may be divided from a semiconductor wafer including chips such as the semiconductor wafer 100 described above. The semiconductor substrate 100 may comprise a chip area 100A and a peripheral pad area 100B surrounding the chip area 100A.

Conductive pads 104 and seal rings 106 may be disposed on the peripheral pad area 100B of the semiconductor substrate 100. The conductive pads 104, such as bonding pads, may be electrically connected to the chips via metal lines (not shown). The seal ring 106 may be disposed on the outer portion of the peripheral pad area 100B to prevent cracks from extending into the chips while dicing the semiconductor wafer. The seal ring 106 may not be electrically connected to the chips.

The chip package, which is divided from the semiconductor wafer according to the embodiment described above, may comprise a main side surface constituted of side surfaces of the protection layer 124, the semiconductor substrate 100, the spacing layer 110 and the package layer 114. The main side surface may have a recess portion 132 at the packaging layer 114. When observed from a top plan view, the packaging layer 114 is surrounded by the recess portion 132. In another embodiment, the recess portion 132 may further extend to the spacing layer 110 (not shown). Alternatively, the recess portion 132 may have a width W which is less than a thickness of the packaging layer 114 and have a depth D which is over the peripheral pad area 100B.

Figure 2A:
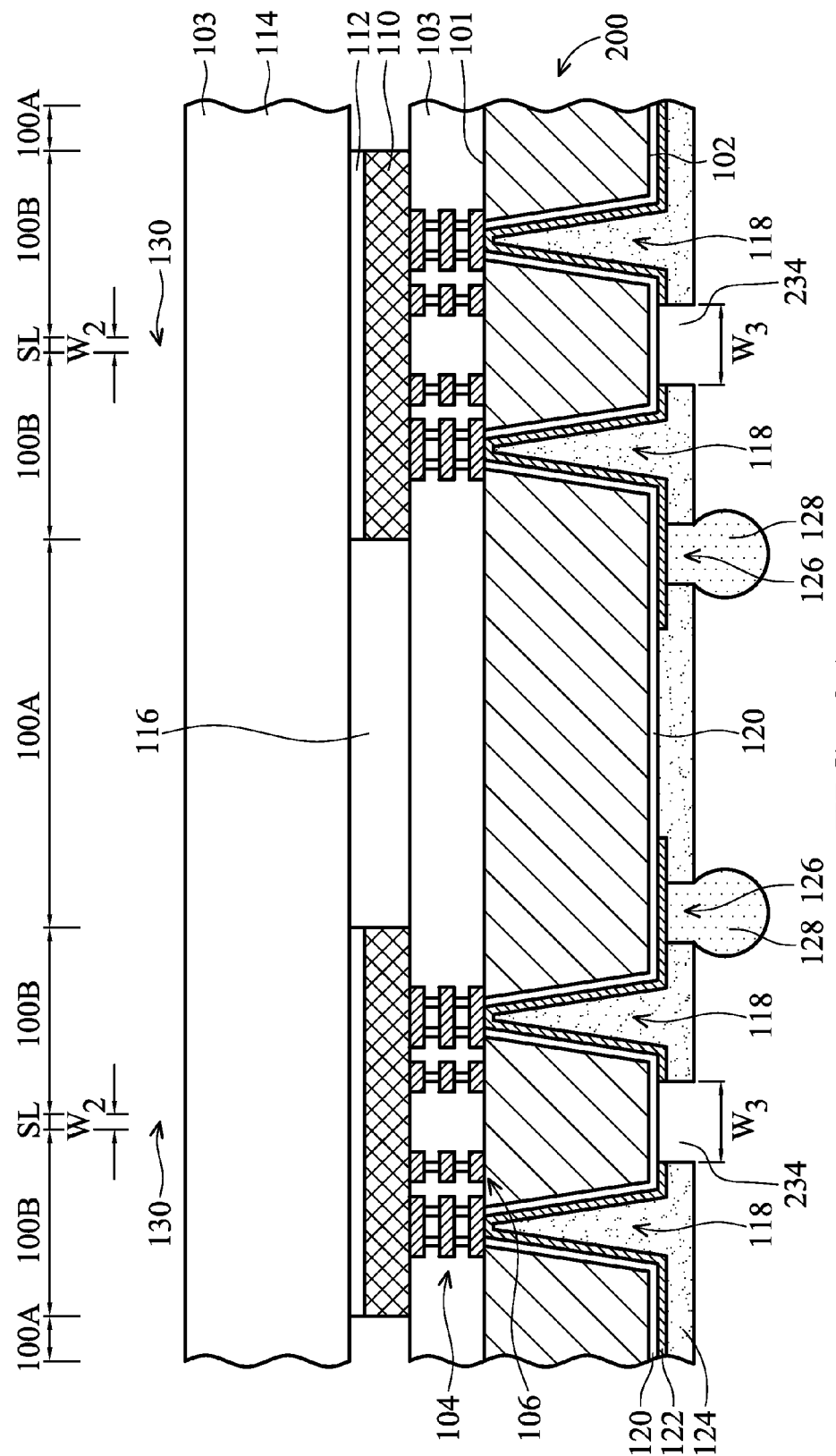
FIGS. 2A to 2B illustrate cross sectional views showing the steps of fabricating a chip package according to another embodiment of the invention.
Figure 2B:
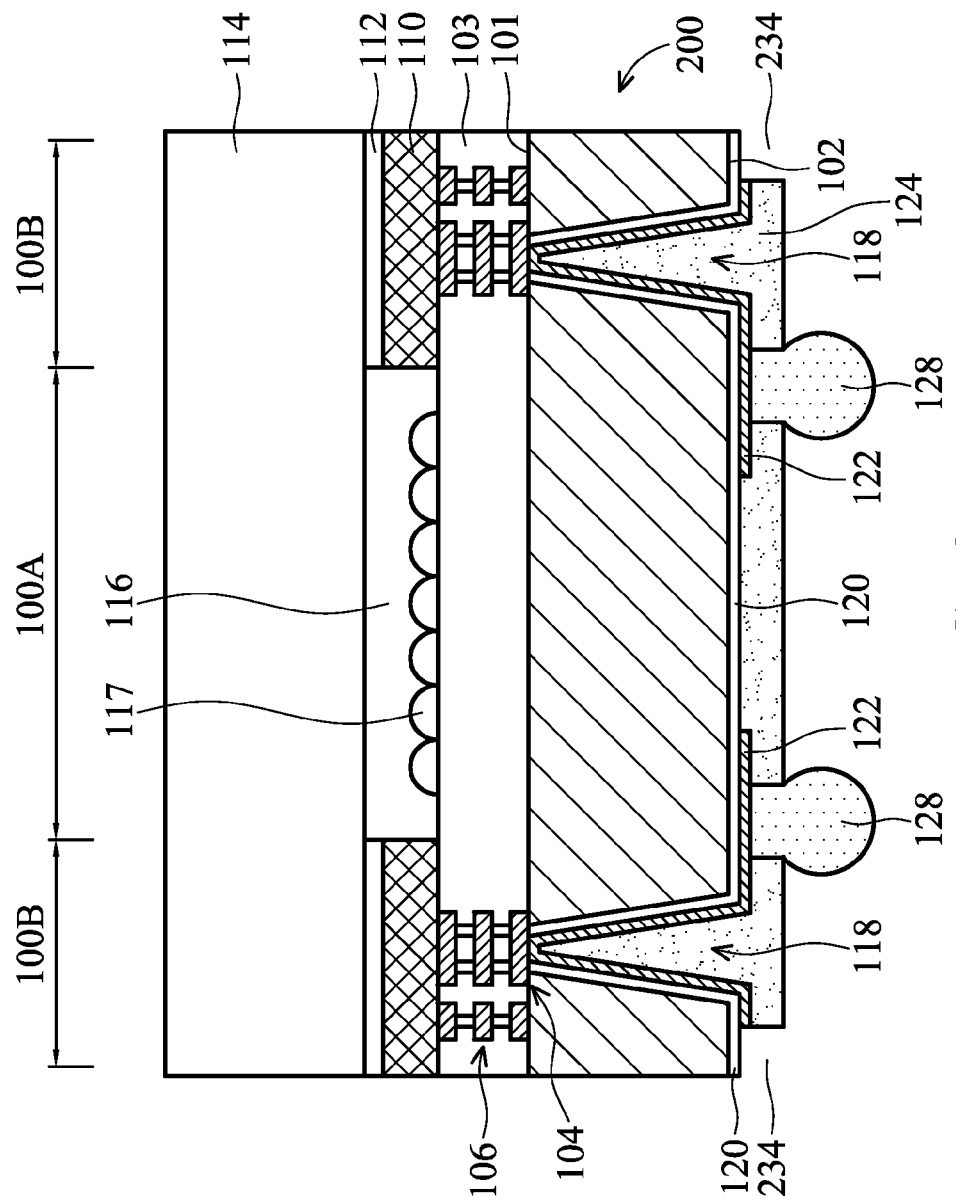

Referring FIGS. 2A to 2B, illustrated are cross sectional views showing the steps of fabricating a chip package according to another embodiment of the invention. At first, a semiconductor wafer structure is formed as shown in FIG. 1F by repeating the steps of FIGS. 1A to 1F described above. The semiconductor wafer structure may comprise a plurality of chip areas 100A and a plurality of peripheral pad areas 100B surrounding the chip areas 100A. Conductive pads 104 and seal rings 106 may be disposed on the peripheral pad area 100 and in an interlayer dielectric layer 103 covering the upper surface 101 of the semiconductor wafer 100. The conductive pads 104 are exposed by the through holes 118. Scribe lines SL may be formed between any two adjacent peripheral pad areas 100B. The insulating layer 120 may be formed on the bottom surface 102 of the semiconductor wafer 100 and sidewalls of the through holes 108. The conductive trace layer 122 may be disposed on the insulating layer 120 and extended to the bottom of the through holes 108 for electrical connection thereto.

Then, referring to FIG. 2A, a protection layer 124 such as a solder mask may be coated onto the insulating layer 120 and the conductive trace layer 122. Then, the protection layer 124 may be patterned by a lithography process to form openings 126 exposing a portion of the conductive trace layer 122 and recess portions 234. The recess portions 234 may be formed along the scribe line SL from the protection layer 124 and have a width W3. Then, solder materials are filled into the openings 126 of the protection layer 124. A reflow process may be performed to the solder materials to form conductive bumps 128 such as solder balls or solder pastes.

Referring to FIG. 2B, the semiconductor wafer 200 may be diced along the line 130 in the scribe line SL and from the bottom surface 102 of the semiconductor wafer 200. For example, the semiconductor wafer 200 may be diced using a cutting knife having a width W2. As such, a plurality of chip packages may be formed. Each of the chip packages may comprise a main side surface constituted of side surfaces of the protection layer 124, the semiconductor substrate 200, the spacing layer 110 and the packaging layer 114. The main side surface may have a recess portion 234 at the protection layer 124.

Figure 3A:
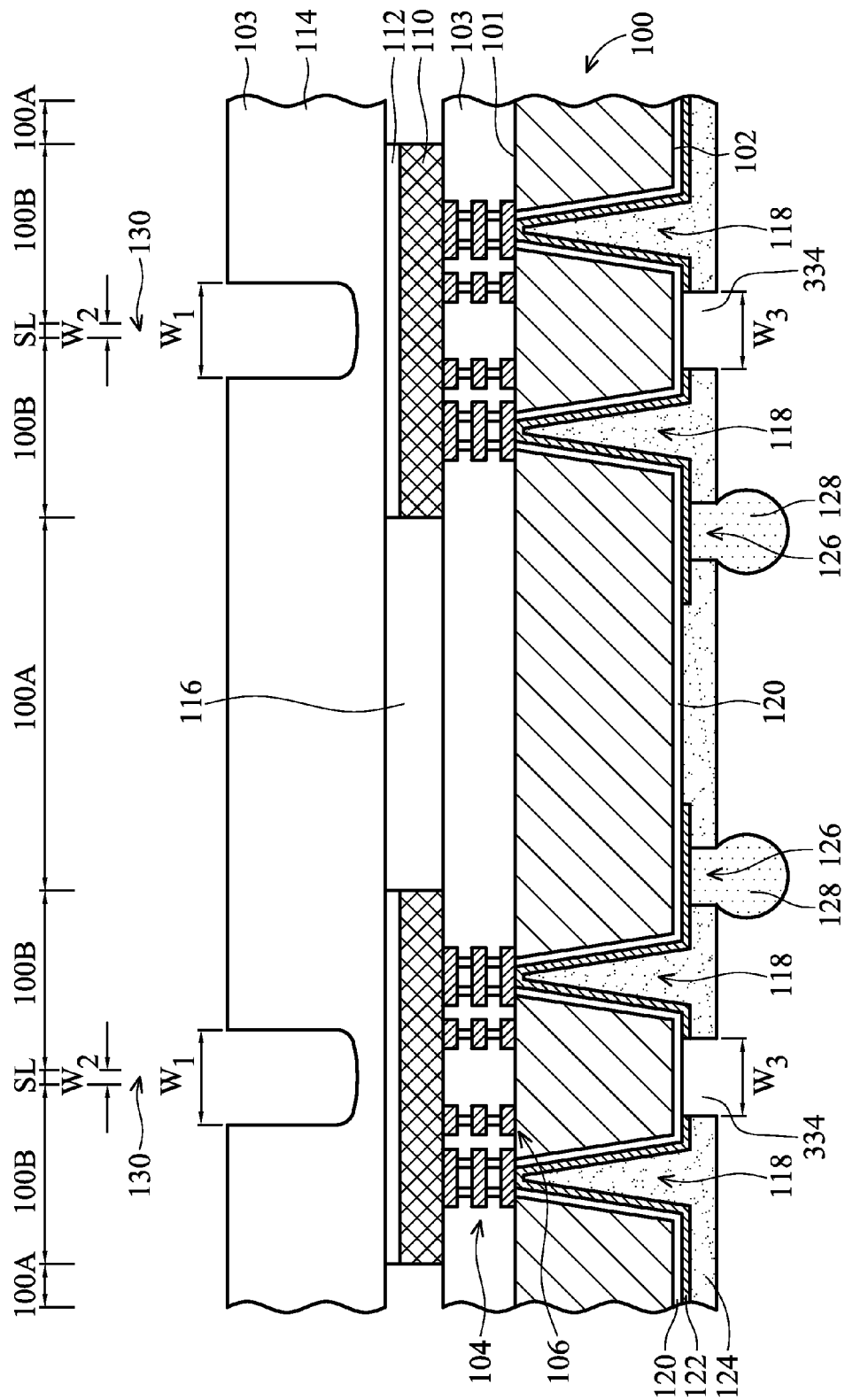
FIGS. 3A to 3B illustrate cross sectional views showing the steps of fabricating a chip package according to yet another embodiment of the invention.
Figure 3B:
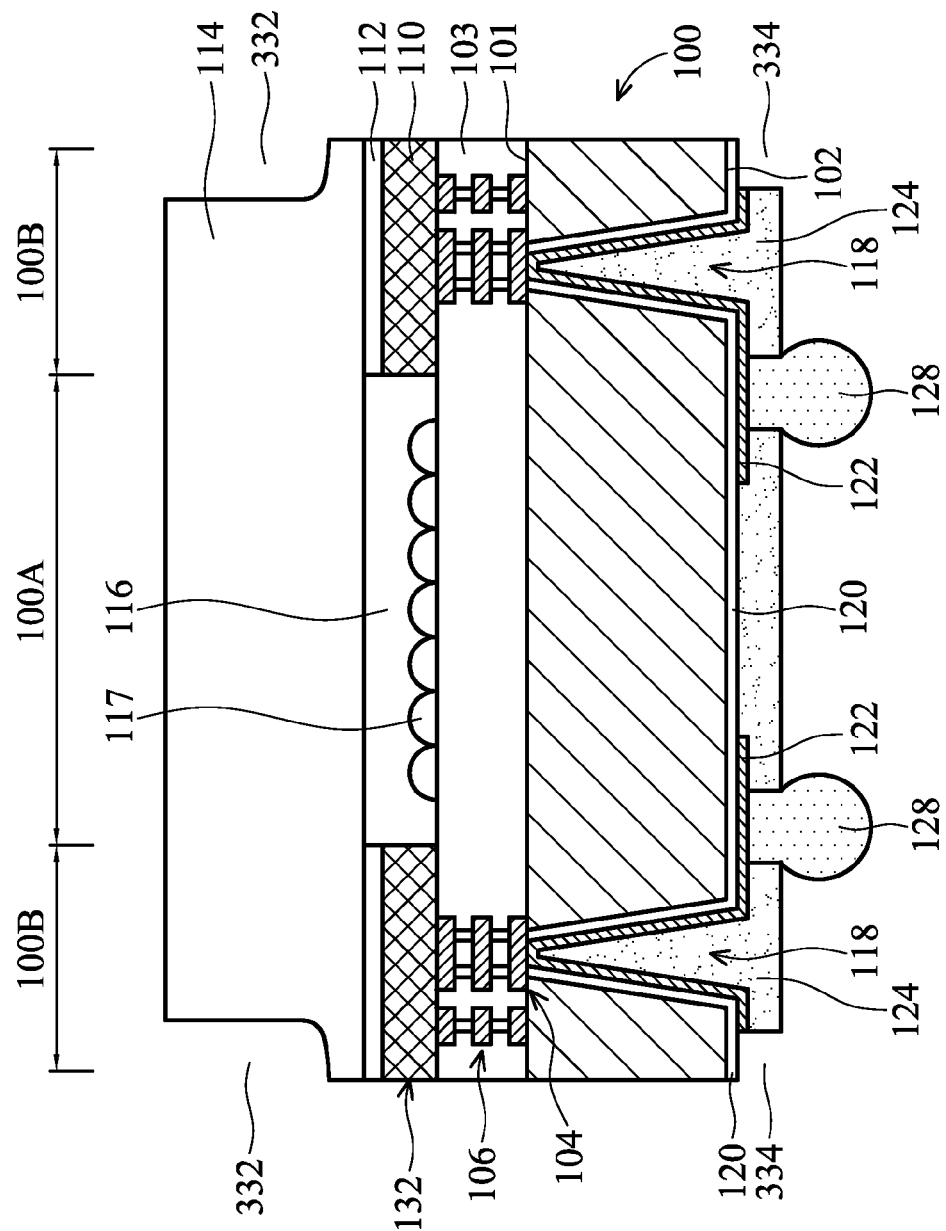

Referring to FIGS. 3A to 3B, illustrated are cross-views of showing the steps of fabricating a chip package according to yet another embodiment of the invention. A semiconductor wafer 300 may be formed by repeating the steps shown in FIGS. 1A to 1G, in which the packaging layer 114 may have a recess portion 322 having a width W1. Then, as shown in FIG. 3A, the protection layer 124 may be patterned by a lithography process. A recess portion 334 along the scribe line SL at the protection layer 124 and openings 126 exposing the conductive trace layer 122 may be formed. The recess portion 334 may have a width W3. It should be noted that although the width W1 may be greater than the width W3 as shown in FIG. 3A, the width W1 may also be less or equal to the width W1 according to requirements of the semiconductor structure or fabrication method thereof. Then, solder materials may be filled in the protection layer and a reflow process may be performed to the solder materials to form conductive bumps 128.

Referring to FIG. 3B, the semiconductor wafer 300 may be diced along a line in the scribe line SL and from the bottom surface 102 of the semiconductor wafer 300. As such, the semiconductor chip packages diced from the semiconductor wafer 300 may have a main side surface constituted of side surfaces of the protection layer 124, the semiconductor substrate 300, the spacing layer 110 and the packaging layer 114. The side main surface may have recess portions 332 and 334 at the packaging layer 114 and at the protection layer 124, respectively. The recess portions 332 and 334 at the packaging layer 114 and at the protection layer 124 may have the same or different depths depending upon the relations of the width W1 and the width W3. For example, FIG. 3B shows a chip package having the same width W1 and width W3.

Figure 4A:
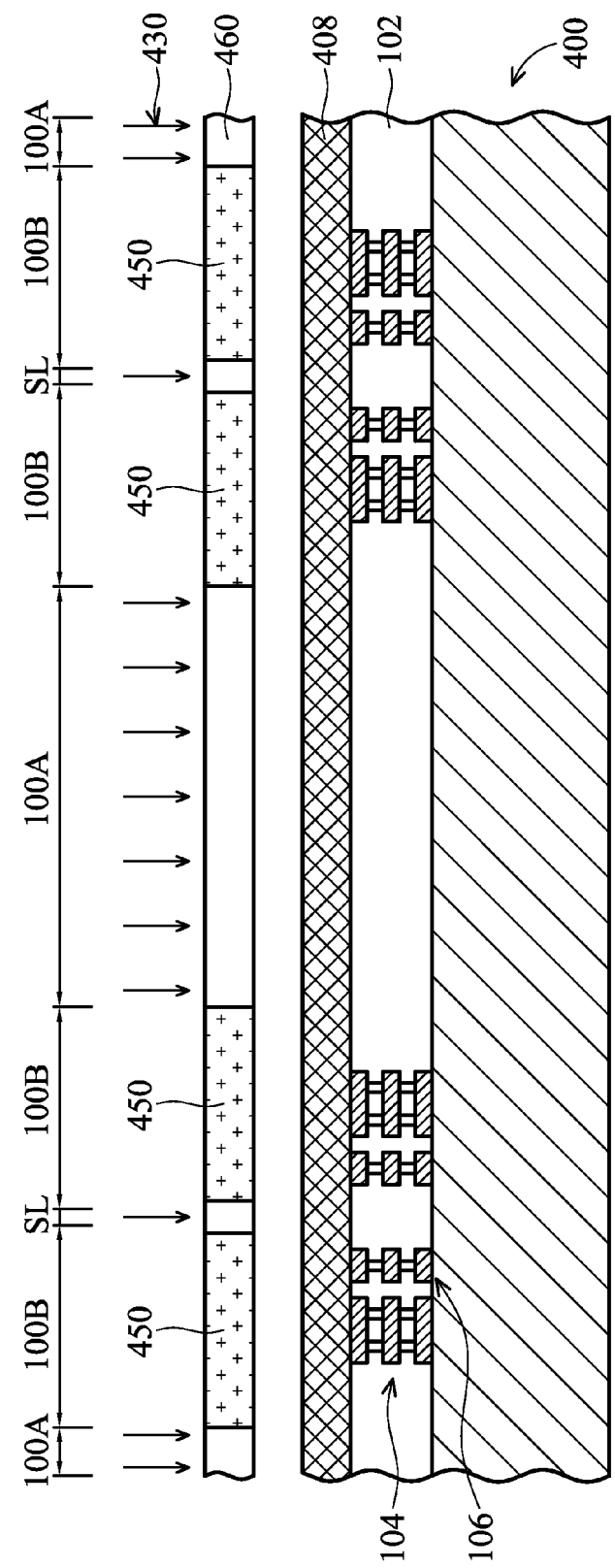
FIGS. 4A to 4C illustrate cross-sectional views showing the steps of fabricating a chip package accordance to still another embodiment of the invention.
Figure 4B:
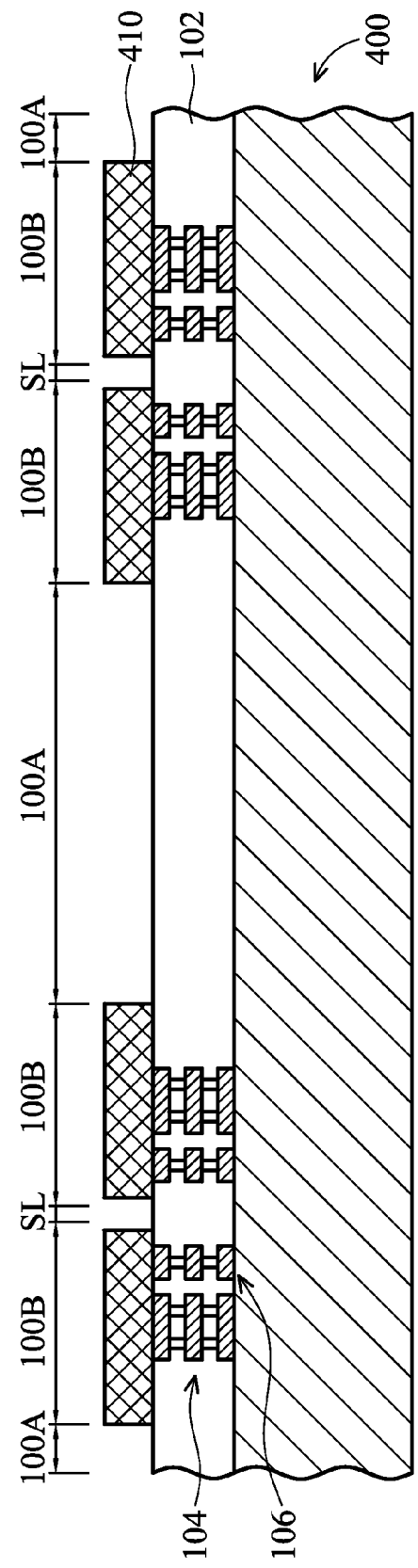
Figure 4C:
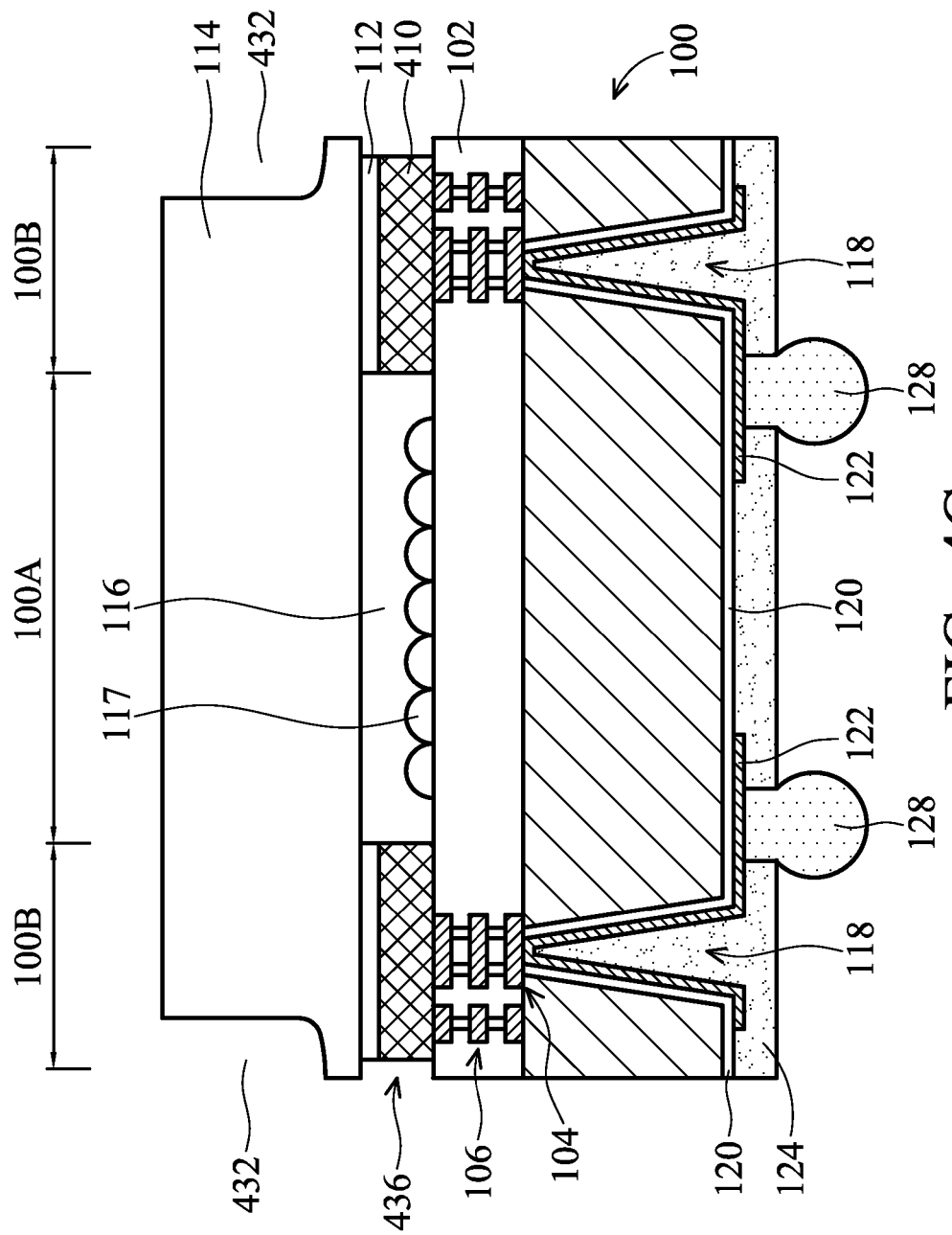

Referring to FIGS. 4A to 4C, illustrated are cross-views of showing the steps of fabricating a chip package according to still another embodiment of the invention. Referring to FIG. 4A, a photomask 460 having mask patterns 450 may be disposed on the spacing layer 408 after the semiconductor wafer structure 400 is fabricated by repeating the steps shown in FIG. 1A. Then, a photography process may be performed to the spacing layer 408 to transfer the corresponding patterns 410 to the spacing layer 408. As shown in FIG. 4B, the spacing layer 410 may be formed on the peripheral pad area 100B and surround the chip area 100A. From the top plan view, any two adjacent chip areas 100A may be separated by the spacing layer 410. Seal rings 116 may be disposed below the spacing layer 410. It should be noted that this embodiment may be combined with any preceding embodiments described above. Thus, the chip package formed by this embodiment may comprise a main side surface constituted of side surfaces of the protection layer 124, the semiconductor substrate 400, the spacing layer 410 and the packaging layer 114. The side main surface may not only have a recess portion at the packaging layer or at the protection layer, but also have another recess portion at the spacing layer. For example, this embodiment can be combined with the embodiment shown in FIGS. 1A to 1I, wherein a chip package as shown in FIG. 4C is formed. The chip package may have a main side surface constituted of the protection layer 124, the semiconductor substrate 400, the spacing layer 410 and the packaging layer 114. The main side surface may have recess portions 432 and 436 at the packaging layer 114 and the spacing layer 410, respectively, where the recess portions 432 and 436 may have different depths.

In other embodiments, a portion of the semiconductor substrate may be removed by an etching process such that a recess portion may also be formed at the semiconductor substrate.

In the embodiments of the present invention, a portion of the front side of the semiconductor wafer such as a portion of the packaging layer may be removed before dicing the semiconductor wafer. A portion of the bottom side of the semiconductor wafer such as removing a portion of the protection layer may be removed before dicing the semiconductor wafer. Also, the portions of the front side and/or the bottom side of the semiconductor wafer may be removed after dicing the semiconductor wafer. Thus, the main side surface of the separated semiconductor substrates may comprise a recess portion at the protection layer, the semiconductor substrate, the spacing layer or the packaging layer arbitrarily. In addition, two or more recessions having the same or different depths also can be formed on the main side surface of the semiconductor substrate.

In an embodiment, the chip package may be used in an image sensor device, such as complementary metal oxide semiconductor device (CMOS), a charge-couple device (CCD), or micro electro mechanical systems (MEMS) device.

The conductive pads and seal rings may comprise copper, aluminum or other suitable metals. The spacing layer may be disposed between the packaging layer and the semiconductor substrate, such that a cavity can be formed between the packaging layer and the semiconductor substrate and surrounded by the spacing layer. In addition, a micro lens array may be formed on the chip area of the semiconductor substrate to increase the light absorption of the image sensor device.

In an embodiment, the packaging layer may be a transparent material such as glass, opal, quartz, plastic or other suitable transparent substrates. It should be noted that a filter and an anti-reflective layer may be optionally formed on the packaging layer. In the embodiment, the packaging layer may be a semiconductor layer such as a silicon layer.

In another embodiment, the spacing layer may completely fill the space between the semiconductor substrate and packaging layer such that no cavity is formed therebetween.

The chip package of the invention may have a main side surface having at least one recess portion formed thereon, and the at least one portion may be at any layers or at any interfaces between any two adjacent layers. Thus, the stress due to different thermal expansion coefficients of the layers can be reduced. In addition, the stress can be also dissipated to the two ends of the main side surface of the chip package. Delamination of the chip package can be avoided.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a semiconductor substrate containing a chip area and a peripheral pad area surrounding the chip area, wherein a conductive pad and a through hole exposing the conductive pad are formed in the peripheral pad area;
a protection layer covering a bottom surface of the semiconductor substrate and the through hole;
a packaging layer formed on an upper surface of the semiconductor substrate, wherein the packaging layer is a substrate; and
a spacing layer formed between the packaging layer and the semiconductor substrate, wherein the spacing layer is a non-electrically conductive material,
wherein the chip packaging has a main side surface constituted of side surfaces of the semiconductor substrate, the protection layer, the packaging layer and the spacing layer, and wherein the main side surface has at least one recess portion at the packaging layer, wherein the packaging layer has a foot portion under the recess portion, and wherein a sidewall of the foot portion is aligned with a sidewall of the semiconductor substrate.

2. A chip package, comprising:
a semiconductor substrate containing a chip area and a peripheral pad area surrounding the chip area, wherein a conductive pad and a through hole exposing the conductive pad are formed in the peripheral pad area;
a protection layer covering a bottom surface of the semiconductor substrate and the through hole;
a packaging layer formed on an upper surface of the semiconductor substrate, wherein the packaging layer is a substrate; and
a spacing layer formed between the packaging layer and the semiconductor substrate, wherein the spacing layer is a non-electrically conductive material,
wherein the chip packaging has a main side surface constituted of side surfaces of the semiconductor substrate, the protection layer, the packaging layer and the spacing layer, wherein the main side surface has at least one recess portion at the packaging layer, and wherein the recess portion at the packaging layer further extends to the spacing layer.

3. The chip package as claimed in claim 1, wherein the recess portion at the packaging layer has a recess depth which does not reach to the chip area.

4. The chip package as claimed in claim 1, wherein the at least one recess portion comprises a recess portion at the protection layer.

5. The chip package as claimed in claim 1, further comprising a gap formed between the packaging layer and the chip area of the semiconductor substrate, wherein the gap is surrounded by the spacing layer.

6. The chip package as claimed in claim 1, wherein the packaging layer is a silicon substrate.

7. The chip package as claimed in claim 1, wherein the packaging layer is a glass substrate.

8. The chip package as claimed in claim 1, wherein the at least one recess portion comprises at least two recessed portions disposed at the packaging layer and the spacing layer, or at the packaging layer and the protection layer.

9. The chip package as claimed in claim 8, wherein the at least two recessed portions have different recess depths.

10. The chip package as claimed in claim 8, wherein the at least two recessed portions have the same recess depth.

11. The chip package as claimed in claim 8, further comprising:
an insulating layer formed on sidewalls of the through hole and the bottom surface of the semiconductor substrate;
a conductive trace layer formed between the insulating layer and the protection layer and extending to the bottom of the through hole for electrical connection to the conductive pad; and
a conductive bump formed in the protection layer and electrically connecting to the conductive trace layer with at least a portion of the conductive bump being exposed on the outside of the protection layer.

12. A method for forming a chip package, comprising:
providing a semiconductor wafer comprising:
a plurality of chip areas and a plurality of peripheral pad areas surrounding the chip areas, wherein each of the peripheral pad areas has a conductive pad and a through hole exposing the conductive pad formed thereon, and any two adjacent peripheral pad areas have a scribe line therebetween;
a packaging layer bonded to an upper surface of the semiconductor substrate by means of a spacing layer;
a protection layer covering a bottom surface of the semiconductor substrate and the through hole;
removing at least a portion of the packaging layer along the scribe lines such that the packaging layer has recess portions having a first width; and
dicing the semiconductor wafer with a second width along the scribe lines to form a plurality of chip packages, wherein the first width is different from the second width.

13. The method as claimed in claim 12, wherein the first width is greater than the second width.

14. The method as claimed in claim 12, wherein the first width is less than the second width.

15. The method as claimed in claim 12, wherein the at least a portion of the packaging layer is removed by a dicing blade, laser, wet etching or dry etching.

16. The method as claimed in claim 12, wherein removing at least a portion of the packaging layer along the scribe line further comprises removing a portion of the spacing layer.

17. The method as claimed in claim 12, wherein the semiconductor wafer further comprises:
an insulating layer formed on sidewalls of the through hole and the bottom surface of the semiconductor wafer; and
a conductive trace layer formed between the insulating layer and the protection layer and extending to the bottom of the through hole for electrical connection to the conductive pads.

18. The method as claimed in claim 17, further comprising:
forming an opening in the protection layer for exposing a portion of the circuit layer; and
forming a conductive bump in the opening and electrically connecting to the conductive trace layer.

19. A method for forming a chip package, comprising:
providing a semiconductor wafer comprising:
a plurality of chip areas and a plurality of peripheral pad areas surrounding the chip areas, wherein each of the peripheral pad areas has a conductive pad and a through via hole exposing the conductive pad formed thereon, and any two adjacent peripheral pad areas have a scribe line therebetween;
a packaging layer bonded to an upper surface of the semiconductor substrate by means of a spacing layer;
a protection layer covering a bottom surface of the semiconductor substrate and the through hole;
removing at least a portion of the protection layer on the dice channel such that the packaging layer has recess portions having a first width; and
dicing the semiconductor wafer with a second width along the scribe lines to form a plurality of chip packages.

20. The method as claimed in claim 19, wherein the protection layer comprises a photo-sensitive insulating material.

21. The method as claimed in claim 19, wherein the step of forming the recess portion having the first width comprises an exposure process and a development process.

22. The method as claimed in claim 19, further comprising removing at least a portion of the packaging layer forming the recess portions having a third width in the packaging layer before forming recess portions in the protection layer.

23. The method as claimed in claim 22, wherein the at least a portion of the packaging layer is removed by a dicing blade, laser, wet etching or dry etching.

24. The method as claimed in claim 22, wherein the first width is different from the third width.

25. The method as claimed in claim 22, wherein the first width is the same with the third width.

26. The method as claimed in claim 22, wherein the semiconductor wafer further comprises:
an insulating layer formed on sidewalls of the through hole and the bottom surface of the semiconductor wafer; and
a conductive trace layer formed between the insulating layer and the protection layer and extending to the bottom of the through hole for electrical connection to the conductive pads.

27. The method as claimed in claim 26, further comprising:
forming an opening in the protection layer for exposing a portion of the conductive trace layer; and
forming a conductive bump in the opening and electrically connecting to the conductive trace layer.

28. The method as claimed in claim 26, wherein the opening and the recess portions having a first width are formed simultaneously.

* * * * *